United States Patent
Wright et al.

Patent Number: 5,148,119
Date of Patent: Sep. 15, 1992

[54] PRECISE REFERENCE VOLTAGE GENERATOR FOR FEEDFORWARD COMPENSATED AMPLIFIERS

[75] Inventors: John W. Wright, Los Altos; Robert C. Dobkin, Monte Sereno, both of Calif.

[73] Assignee: Linear Technology Corporation, Milpitas, Calif.

[21] Appl. No.: 673,466

[22] Filed: Mar. 22, 1991

[51] Int. Cl.$^5$ .............................................. H03F 3/45
[52] U.S. Cl. .................... 330/259; 330/260; 330/261
[58] Field of Search ............... 330/85, 151, 259, 260, 330/261

[56] References Cited

U.S. PATENT DOCUMENTS

| | | | |
|---|---|---|---|
| 3,562,660 | 2/1971 | Pease | 330/30 |
| 3,919,654 | 11/1975 | Toumani | 330/29 |
| 4,435,685 | 3/1984 | Eckert et al. | 330/261 |
| 4,658,157 | 4/1987 | McGowan | 330/253 X |
| 4,789,799 | 12/1988 | Taylor et al. | 307/540 |

OTHER PUBLICATIONS

Data Sheet, "LM101A/LM201A/LM301 Operational Amplifiers," National Semiconductor Corporation 1982 Linear Databook, pp. 3–128 et seq.

Data Sheet, "LM741/LM741A/LM741C/LM741E Operational Amplifiers," National Semiconductor Corporation 1982 Linear Databook, pp. 3–257 et seq.

Data Sheet, "LM118/LM218/LM318 Operational Amplifiers," National Semiconductor Corporation 1986 Linear Databook, pp. 3–165 et seq.

Data Sheet, "LM101A/LM301A/LM107/LM307 Operational Amplifiers," National Semiconductor Corporation 1986 Linear Databook, pp. 2–177 et seq.

Data Sheet, "LT118A/LT318A/LM118/LM318 High Speed Operational Amplifier," National Semiconductor Corporation 1986 Linear Databook, pp. 2–191 et seq.

*Primary Examiner*—James B. Mullins
*Attorney, Agent, or Firm*—Mark D. Rowland

[57] ABSTRACT

A reference voltage generator is presented for use in a differential amplifier. The reference voltage provided by the generator tracks the non-signal dc conditions of a differential input stage and provides a reference voltage to a level-shifting stage so that feedforward compensation can be used to provide extended bandwidth without settling time problems.

28 Claims, 5 Drawing Sheets

PRECISE REFERENCE VOLTAGE GENERATOR FOR FEEDFORWARD COMPENSATED AMPLIFIERS

BACKGROUND OF THE INVENTION

This invention relates to improvements in the performance of integrated circuit amplifiers. More particularly, this invention relates to improvements in the input stage of an integrated circuit amplifier which allow the amplifier's bandwidth and stability to be improved without adversely affecting its settling time.

The high-frequency performance of conventional integrated circuit operational amplifiers is typically limited by various phase delays introduced into the signal path by elements of the circuit. For example, one of the most important limiting factors results from the poor frequency characteristics of lateral pnp transistors in the signal path. In known conventional multi-stage integrated operational amplifiers, such as the LM118 commercially available from National Semiconductor Corporation and other manufacturers, lateral pnp transistors are used in a level shifting and differential-to-single-ended conversion stage which is placed between the differential input stage and the main gain stage. The poor frequency characteristics of the lateral pnp transistors introduce a pole into the open-loop transfer function of the operational amplifier. This pole severely limits the unity-gain frequency of the amplifier and introduces excess phase shift which degrades the stability of the amplifier.

A popular method of overcoming (at least in part) the limitations imposed by the pnp transistors has been the use of feedforward compensation. The intention in this type of compensation is to bypass the level shifting stage at high frequencies using a feedforward capacitor. The level shifter lends itself well to this procedure because its output is a high impedance node. Such a feedforward capacitor is used, for example, in the previously referenced LM118 circuits, in which the feedforward capacitor couples a high frequency signal from the output of the non-inverting input side of the differential input stage directly to the single-ended output of the level shifter.

In addition, conventional feedforward amplifiers such as the LM118 eliminate one-half of the high frequency signal through the slow lateral PNP's. The amplifier is "single-ended" with a shunt capacitor coupled to the output of the inverting input side of the differential input stage. This, in conjunction with feedforward compensation, has been used to greatly extend the useful bandwidth of conventional operational amplifiers.

In the conventional circuits that use the above-described shunt capacitor, the shunted output of the differential input stage is provided to the level shifting stage as a reference voltage source to maintain a bias balance in the differential level shifter. As is well-known, it is important that the reference voltage provided to one differential input of the level shifter stage should track the "non-signal dc component" of the other differential input of the level shifter stage in order to keep the amplifier's input offset voltage as small as possible. As used herein, the phrase "non-signal dc component" generally refers to the component of a voltage or current in an amplifier circuit that would appear if a set of identical common-mode inputs were applied to the amplifier (i.e., as if the differential input terminals of the amplifier circuit were tied together), and those inputs were within the common-mode operating range of the amplifier. When differential input signals are applied, the current or voltage may further include a "signal component."

Disadvantageously, the shunt capacitor has its own adverse effect on the performance of the operational amplifier. The shunt capacitor causes a doublet to be formed in the open loop response of the amplifier. The pole and zero in this doublet are separated by an octave and cause the amplifier to have poor settling time characteristics; i.e., there is an increase in the time taken for the amplifier output to settle to within a certain tolerance range of its final value after a step change in the input.

Applicants have recognized that the performance of a conventional operational amplifier using feedforward compensation can be improved by providing a novel reference voltage generator in the input stage of the amplifier. The reference voltage tracks the non-signal dc component of the output voltage of the differential input stage, but has no differential signal present and does not require a shunt capacitor. This eliminates the doublet from the amplifier's transfer function caused by the shunt capacitor. The improvement provides wider bandwidth without the settling time problem. Applicants have further recognized that the performance of other types of integrated amplifiers, such as an instrumentation amplifier, can be improved in a similar manner.

Another well-known limitation to the high-frequency capability of a conventional integrated circuit amplifier is the phase shift introduced by the current mirror circuit used to perform differential-to-single-ended signal conversion. The current mirror circuit introduces a pole into the overall amplifier response that erodes the amplifier stability for a given amplifier bandwidth. The effects of the delay through the current mirror have not been reduced in conventional integrated circuit operational amplifiers.

In a co-pending application Ser. No. 07/673,475 entitled "An Improved Amplifier Level Shift With Gain Enhancement" and filed concurrently herewith, applicants provide a novel non-differential level shifting stage which can be used to enhance the gain and input range of an amplifier incorporating the present invention and which addresses the above-mentioned problem of delay in the current mirror circuit. The novel non-differential level shifting stage takes advantage of the single-ended signal provided by the present invention, allowing such a signal to be level shifted without having to pass through a current mirror.

In view of the foregoing, it is an object of the present invention to provide a reference voltage generator which tracks the non-signal dc component of the output of a differential input stage and provides a reference voltage to a level-shifting stage so that feedforward compensation can be used to provide extended bandwidth without settling time problems.

SUMMARY OF THE INVENTION

The aforementioned and other objects of the invention are accomplished by providing a reference voltage generator which tracks the non-signal dc component of the output of the differential input stage and supplies the reference voltage to a differential second stage of the amplifier. To optimize its tracking capability, the elements of the reference voltage generator preferably duplicate, and match the characteristics of, corresponding elements in one side of the differential input stage.

Exemplary embodiments of the reference voltage generator of the present invention in integrated circuit operational amplifiers are shown and described. In these particular embodiments, the reference voltage generator includes an npn transistor, a current source, and a load resistance. The emitter of the transistor is fed by the current source and the collector is connected via the load resistance to the positive power supply voltage of the amplifier. The resulting current through the load resistance maintains a voltage on the collector of the transistor. Thus, a stable reference voltage is obtained without the use of a shunt capacitor.

The reference voltage generator is made to track the non-signal dc component of the output voltage of the input stage by coupling the base of the transistor to the base of a corresponding transistor in one side of the differential input stage. Further tracking accuracy can be obtained preferably by combining this voltage generator circuit with the use of conventional design, layout and trimming techniques to obtain accurate matching between the elements of the reference voltage generator and the differential input stage.

The output of the reference voltage generator is fed, together with one output of the differential portion of the input stage, to the level shifting stage of the amplifier. If a non-differential level shifting stage is used, for example a stage of the type described in applicant's aforementioned co-pending application, the present invention allows one entire side of the level shift and current mirror circuit of that stage to contain only a non-signal dc component from the input stage, such that a high frequency signal can be passed through the level shifting stage without requiring that signal to go through the current mirror circuit, and this is accomplished without the use of a shunt capacitor.

Exemplary embodiments of the reference voltage generator of the present invention in integrated circuit instrumentation amplifiers also are shown and described.

BRIEF DESCRIPTION OF THE DRAWINGS

The above and other objects and advantages of the present invention will be more apparent upon consideration of the following detailed description taken in conjunction with the accompanying drawings in which like reference characters refer to like parts throughout, and in which.

DETAILED DESCRIPTION OF THE INVENTION

Figure 1:
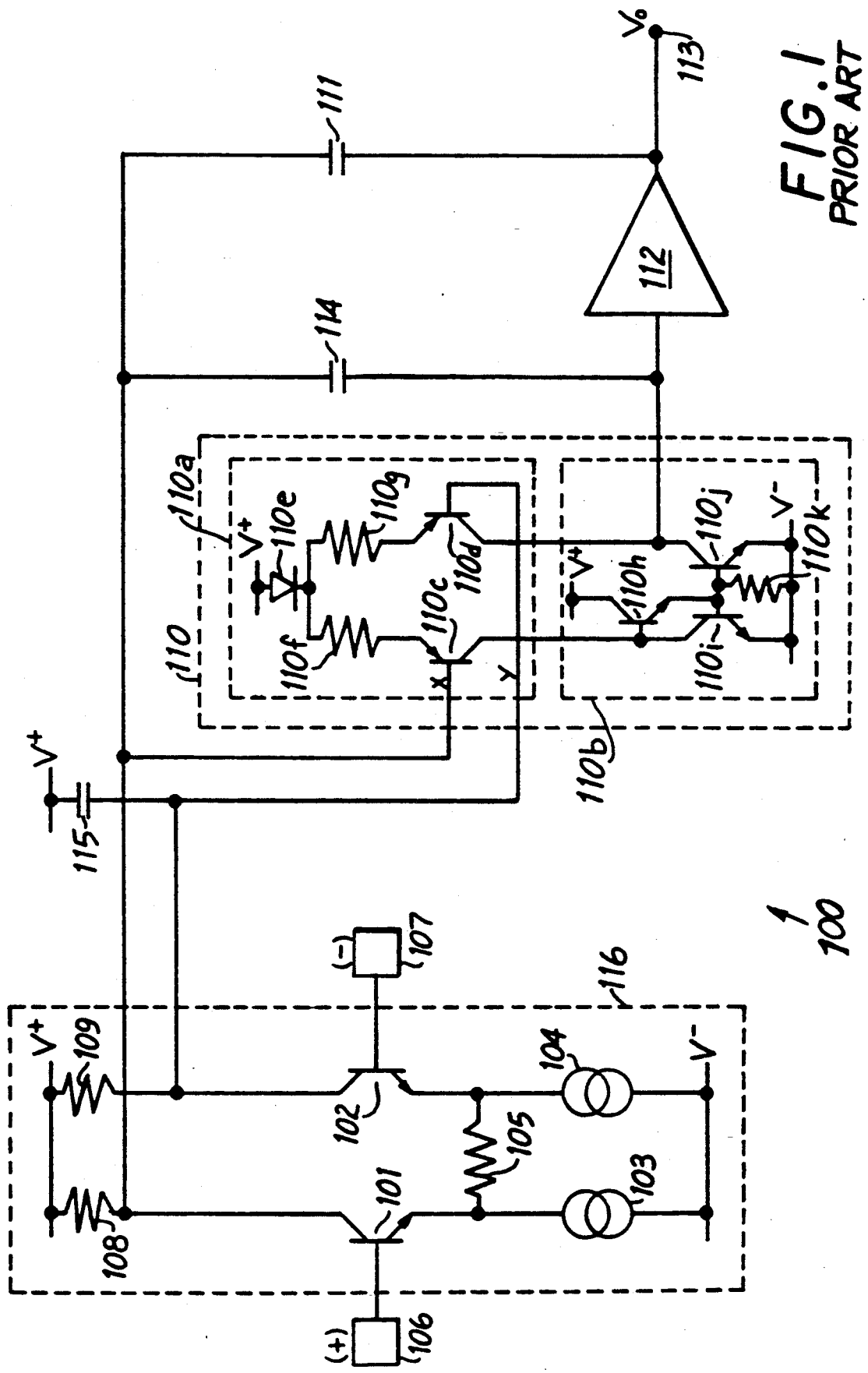
FIG. 1 is a simplified block schematic diagram of a conventional operational amplifier with feedforward compensation.

FIG. 1 shows a simplified block schematic diagram of a conventional multiple stage operational amplifier 100 using feedforward compensation. Transistors 101 and 102, together with resistors 105, 108 and 109 and current sources 103 and 104, form a conventional differential input stage 116. The emitters of transistors 101 and 102 are connected together by resistor 105 so that differential input voltages applied between the non-inverting 106 and inverting 107 inputs of differential input stage 116 cause a current to flow in resistor 105. This current appears as a difference in the collector currents of transistors 101 and 102. The collectors are connected to the positive power supply voltage via load resistors 108 and 109 which have the same resistance. Thus, the difference in collector currents results in a differential output voltage appearing between the two collectors. This difference voltage is fed to the inputs of level shifter 110.

Level shifter 110 includes a pnp level shifting stage 110a driving an npn current mirror 110b, as is typical of conventional operational amplifier circuits of the type shown in FIG. 1. The pnp transistors 110c and 110d, which along with diode 110e and resistors 110f and 110g comprise pnp level shifting stage 110a, introduce a pole into the overall amplifier transfer function which causes excess phase shift with increasing frequency and adversely affects the amplifier stability. Thus, frequency compensation is required. This is accomplished conventionally using the technique known as "narrowbanding" where the amplifier's gain is made to roll-off with increasing frequency, so that a safe phase margin is maintained at the unity-gain frequency. As is shown in operational amplifier 100, this is typically performed in conventional operational amplifier circuits by negative feedback of high frequencies through a "Miller effect" capacitor 111 from the output 113 of the gain stage 112 to the input of level shifter 110.

Narrowbanding severely limits the bandwidth of the operational amplifier. Therefore, when designing amplifiers for large bandwidth applications, compensation by straightforward narrowbanding alone is typically not satisfactory. To achieve stability and simultaneously to maximize bandwidth, feedforward compensation is used often in addition to narrowbanding. In this type of compensation, rather than merely sacrificing gain at high frequencies, the source of the excess phase shift is removed. Narrowbanding is still used to ensure stability, but now the frequency at which the gain is made to roll-off is increased substantially, for example by reducing the capacitance of Miller capacitor 111.

In FIG. 1, capacitor 114 illustrates a typical conventional feedforward compensation scheme. The poor frequency characteristics of the pnp transistors 110c and 110d in level shifter 110 are counteracted by passing high frequency signals around the level shifter instead of through it. The effect of capacitor 114 is to increase the frequency of the dominant pole and thus to increase the gain bandwidth of the amplifier. As discussed previously, level shifter 110 includes a current mirror circuit 110b for performing differential-to-single-ended signal conversion.

High frequency differential to single-ended conversion is performed by capacitor 115. This capacitor effectively shunts away the ac portion of the signal at the collector of transistor 102 so that this signal acts as a reference voltage which is applied to one input y of the level shifter. The signal at the collector of transistor 101 can then be regarded as a single-ended signal which is applied to a second input x of the level-shifter.

To minimize the amount of signal passing through transistor 110d, the voltage at the collector of transistor 102 should contain as little ac signal as possible. This condition is obtained, in conventional circuits, by using as large a shunt capacitor as possible. Large capacitance values are often obtained by supplementing integrated capacitor 115 with off-chip discrete capacitors. However, even if it has a very large value, capacitor 115 has the disadvantage that it introduces a pole-zero pair (doublet) into the amplifier's open-loop transfer function.

The doublet introduced by capacitor 115 has negligible effect on the small-signal characteristics, but it increases the settling time of the amplifier. Thus a new way has been sought for maintaining the benefits of large bandwidth offered by feedforward compensation and improved stability, while at the same time eliminating the problem of long settling time associated with the doublet introduced by capacitor 115. Specifically, an improved circuit for supplying level shifter 110 with a reference voltage is required.

Figure 2:
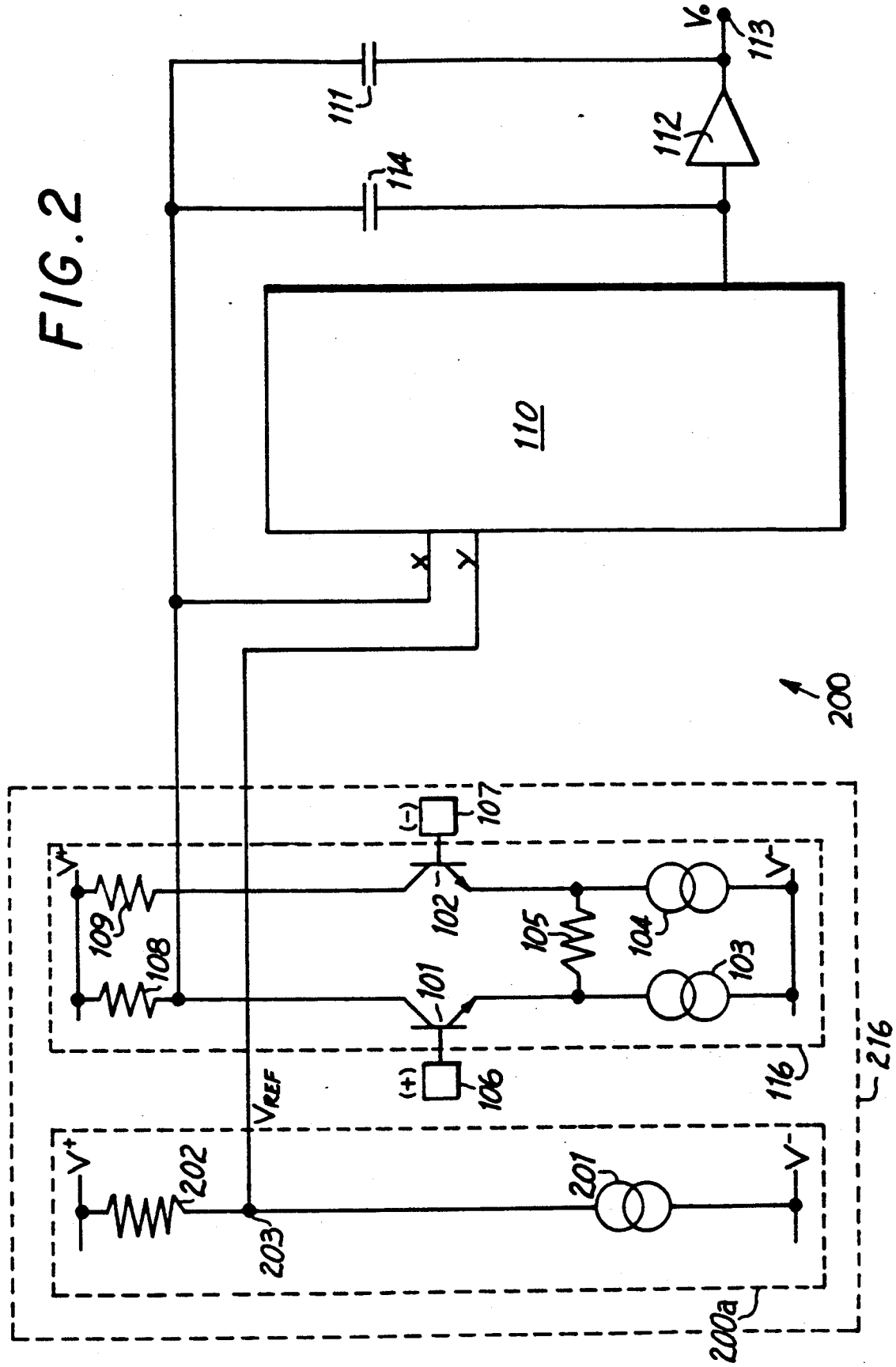
FIG. 2 is a simplified block schematic diagram of an operational amplifier using feedforward compensation and a separate reference voltage source, provided for illustrating benefits obtained with the invention to be described.

FIG. 2 shows a schematic block diagram of a feedforward compensated amplifier 200 having a reference voltage generator circuit 200a designed to meet these requirements in accordance with the principles of the present invention. Amplifier 200 is shown for the purposes of introducing and illustrating benefits of the preferred embodiment of the invention to be described in connection with FIG. 3. In amplifier 200, a stable reference voltage is supplied to level shifter 110 from the new voltage generator 200a rather than from the collector of transistor 102. Current sources 103 and 201 are substantially identical, and load resistors 108 and 202 are likewise substantially identical. Thus, ignoring base currents and current source imperfections, the stable reference voltage $V_{REF}$ at node 203 tracks the non-signal dc component of the voltage at the collector of transistor 101. It is therefore no longer necessary to shunt the signal on the collector of transistor 102, and capacitor 115 can be removed. Deriving the reference voltage from a separate source eliminates the open-loop doublet and the resulting settling time problem.

It is important that the reference voltage should track the non-signal dc component of the single-ended signal. If these two voltages are different, the level shifter interprets this difference as an input signal which it amplifies. The effect of this difference must be removed by applying a non-zero voltage to the input of the amplifier. This is the input offset voltage which is an important parameter in operational amplifier specifications and is required to be as small as possible. Thus, it is important to minimize dc imbalances.

In practice, the circuit of FIG. 2 has certain disadvantageous characteristics which prevent it from minimizing the dc imbalances in the voltages provided to the level shifting stage. Firstly, the collector current in transistor 101 is less than its emitter current by an amount equal to its base current. Secondly, due to the finite output resistance of current source 103, common-mode input voltages cause the collector currents of transistors 101 and 102 to change. These two effects are not compensated for in the circuit of FIG. 2 so that, in practice, voltage $V_{REF}$ may not be the same as the non-signal dc component of the collector voltage of transistor 101.

Figure 3:
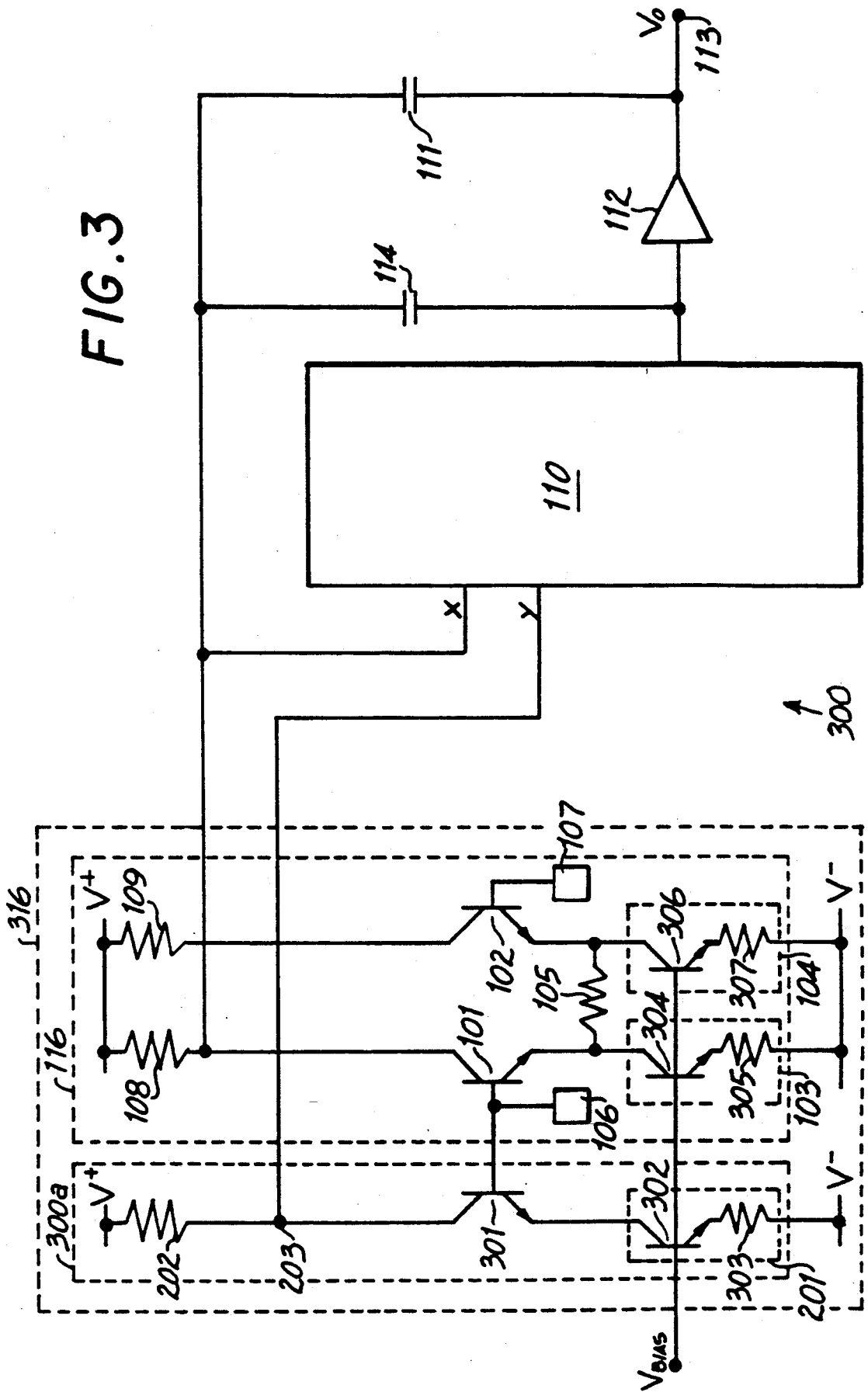
FIG. 3 is a simplified block schematic diagram of an operational amplifier incorporating an embodiment of the reference voltage generator of the present invention and a conventional level shifting stage.

The disadvantages of the circuit of FIG. 2 are eliminated in the circuit shown in FIG. 3 which is a simplified block schematic diagram of conventional operational amplifier 100 modified to include a preferred embodiment of the present invention. Operational amplifier 300 now includes a precise reference voltage generator 300a in input stage 316 which tracks the non-signal dc component of the collector voltage of transistor 101. The circuit is derived from that of FIG. 2 by including transistor 301.

Transistor 301, load resistor 202, and current source 201 comprise precise reference voltage generator circuit 300a. These elements are preferably designed and laid out to match the device characteristics of, and are connected in the same configuration as, elements 101, 108, and 103 respectively. Current sources 103, 104, and 201 may, for example, comprise three substantially identical npn transistors 302, 304, and 306 and three substantially identical resistors 303, 305, and 307. Transistors 302, 304, and 306 are preferably connected to a common bias voltage $V_{BIAS}$ as shown to provide matched biasing for the current sources. The bias voltage $V_{BIAS}$ can be generated in any conventional manner.

In the circuit of FIG. 3, the bases of transistors 101 and 301 are connected together. This has the effect of overcoming the disadvantages of the circuit of FIG. 2. In the circuit of FIG. 3, transistors 101 and 301 preferably have the same base, emitter, and collector currents. In addition, assuming the corresponding circuit elements are precisely matched as is preferred, any common mode input signal will affect the outputs of current sources 103 and 201 identically. Thus, the collector voltage of transistor 301 tracks the non-signal dc component of the collector voltage of transistor 101 precisely. However, as explained more fully below, the collector voltage of transistor 301 does not follow fluctuations in the component of the collector voltage of transistor 101 resulting from current conducted by resistor 105.

When a pair of non-identical (i.e. differential) inputs are applied to terminals 106 and 107, a signal voltage component appears at the collector of transistor 101 due to the differential current flowing through emitter resistor 105. No such resistor is connected to the emitter of transistor 301, so no differential current flows in its collector, and no signal voltage component appears there. Thus, the collector of transistor 301 acts as a reference voltage source, having the same value as the non-signal dc component of the collector voltage of transistor 101. This provides well-balanced inputs for level shifter 110.

It should be apparent to one of skill in the art that the desirable tracking capability of the reference signal provided to level shifter 110 can be best achieved by implementing the operational amplifier as an integrated circuit in which the elements of the reference voltage generator circuit closely duplicate the elements of one side of the differential portion of input stage 316, as shown in FIG. 3. Of course, in an amplifier circuit in which a different differential input stage than that shown in FIG. 3 is used, the reference voltage generator can be modified to duplicate the particular input stage design that is chosen.

It should also be apparent that the reference voltage generator of the present invention can be used with various conventional differential level shifting stages.

Alternatively, the present invention can be advantageously combined in an integrated amplifier circuit with a non-differential level shifting stage, for example a novel stage of the type disclosed in applicants' aforementioned co-pending application Ser. No. 07/673,475 entitled "An Improved Amplifier Level Shift With Gain Enhancement" and filed concurrently herewith, the entire disclosure of which is incorporated herein by reference. When used together with a non-differential level shifting stage such as one of the exemplary embodiments described and shown in applicants' co-pending application, in which a pair of NPN transistors are interposed between the input stage and the PNP level shift, there is a reversal of phase introduced by the NPN transistors not present in the conventional level shifting stage described and shown herein. As a result, if such a level shifting stage were used, the connections shown in FIG. 3 herein between the input stage and the level shifting stage would be reversed. More particularly, unlike the amplifier circuit shown in FIG. 3, an amplifier circuit incorporating both the present invention and one of the exemplary non-differential level shifting circuits of applicants' co-pending application would be connected such that the single-ended signal from the collector of transistor 101 is coupled to the side of the level shifting stage from which the single-ended output of that stage is taken. Likewise, in that circuit, the reference voltage signal from the collector of transistor 301 would not be connected to the side of the level shifting stage from which the single-ended output of that stage is taken (as shown in FIG. 3), but would instead be connected to the side opposite that shown in FIG. 3. In such a preferred amplifier circuit, a high frequency signal entering the level shifting stage bypasses the current mirror load, such that the bandwidth of the amplifier is no longer limited by the delaying effect of the current mirror load.

It is further preferred that, in an integrated circuit implementation of the amplifier, the elements of reference voltage generator circuit 300a be designed and laid out such that the temperature coefficients and other process-related characteristics of the devices comprising reference voltage generator circuit 300a are precisely matched to the corresponding devices of one side of the differential portion of input stage 316. This can be accomplished using known conventional integrated circuit device design and layout techniques. An externally adjustable null network, resistor trim networks, and input bias current compensation, all implementable using conventional techniques, also can be used to further reduce dc imbalances and bias errors in the input stage.

On the other hand, depending on the tolerance one is willing to accept in the tracking capability of the reference voltage, less precise alternative implementations of the present invention can be used. For example, a tracking reference voltage might be generated by using current sources and resistors in reference voltage generator circuit 300a that are not identical, but proportional, to those in the differential portion of the input stage, such that the dc voltage at the collector of transistor 301 is still made to track the non-signal dc component of the voltage at the collector of transistor 101. Also, reference voltage generator circuit 300a might be implemented such that it is connected to the inverting side of the differential portion of input stage 300a instead of the non-inverting side as shown in FIG. 3.

The precise reference voltage generator of the present invention can be used in various circuits, other than operational amplifier circuits of the type shown in FIGS. 1-3, which require a reference voltage that tracks the non-signal dc component of a second voltage. An example, to be discussed below, is an instrumentation amplifier with feedforward compensation. Instrumentation amplifiers are designed to have very high common-mode rejection ratio, to operate with a predetermined gain, and to have a high input impedance on both the inverting and the non-inverting inputs.

Figure 4:
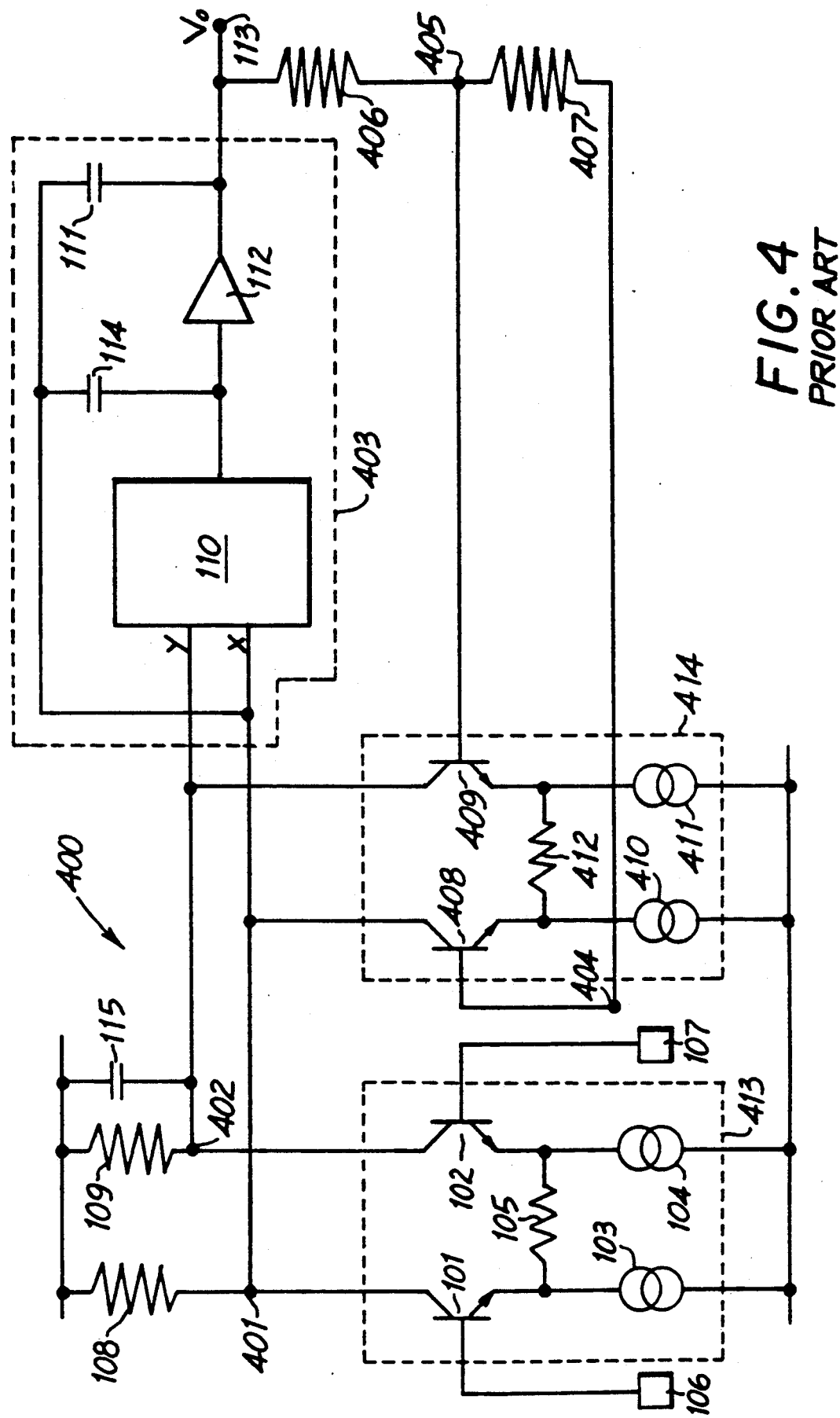
FIG. 4 is a simplified block schematic diagram of a conventional instrumentation amplifier using feedforward compensation.

A simplified schematic of a conventional instrumentation amplifier 400 with feedforward compensation is shown in FIG. 4. The circuit comprises: two similar differential transconductance stages 413 and 414 feeding a common pair of load resistors 108 and 109; a voltage gain block 403 including level shifting stage 110, main gain stage 112 and a feedforward and compensation network comprising capacitors 111 and 114; and a feedback network comprising resistors 406 and 407.

A differential input voltage applied between the non-inverting 106 and inverting 107 inputs of transconductance stage 413 causes a differential current to flow in load resistors 108 and 109, and causes voltages at nodes 401 and 402 to be different. However, gain block 403 is connected in a negative feedback loop which acts so as to equalize the voltages at nodes 401 and 402. This equality is maintained by forcing the differential voltage between nodes 404 and 405 to have equal magnitude and opposite polarity to that between nodes 106 and 107. This causes the currents flowing through transistors 408 and 409 to balance the currents in transistors 101 and 102 so that equal currents flow through resistors 108 and 109. Resistors 406 and 407 set the gain of the instrumentation amplifier.

Feedforward compensation of the instrumentation amplifier is performed in the same way that it was for the operational amplifier of FIG. 1, i.e., with the use of capacitors 111, 114, and 115. As before, the presence of capacitor 115 causes a doublet to appear in the transfer function, and this leads to long settling times.

Figure 5:
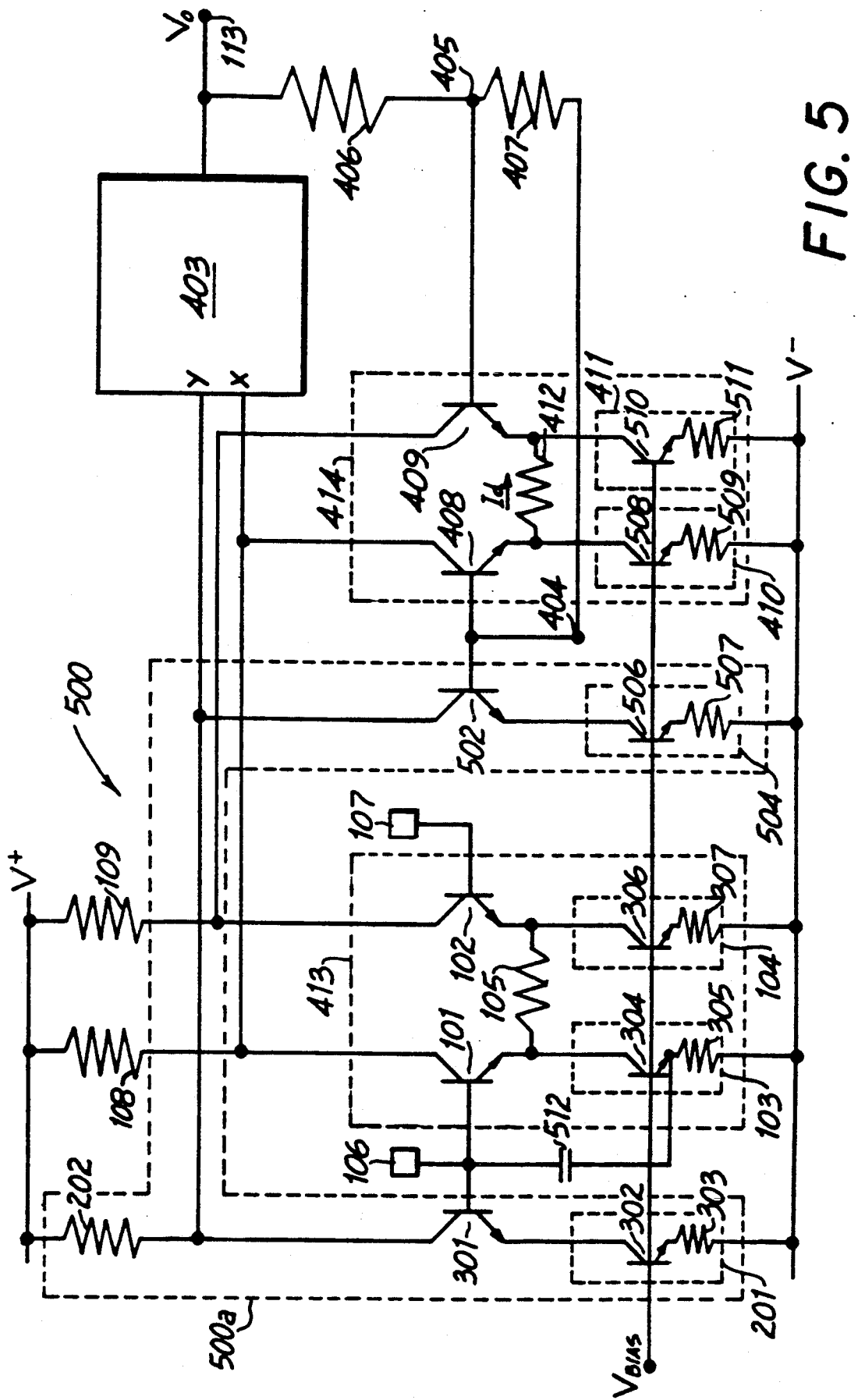
FIG. 5 is a simplified block schematic diagram of an embodiment of the reference voltage generator of the present invention in the instrumentation amplifier of FIG. 4.

The settling time problem is eliminated using an embodiment 500a of the feedforward reference voltage generator of the present invention in the instrumentation amplifier 500 as shown in FIG. 5. In this circuit, the reference voltage required by level shifter 110 within gain block 403 is derived from the reference voltage generator 500a rather than from the collectors of transistors 102 and 409 shunted by capacitor 115. Thus, the effect of capacitor 115 on the amplifier's transfer function is removed and the doublet causing the long settling time is eliminated.

As shown in FIG. 5, reference voltage generator 500a includes a first circuit branch comprising npn transistor 301 and current source 201 connected in series with load resistor 202. As in the operational amplifier of FIG. 3, npn transistor 301 and current source 201 are designed to match the corresponding elements of the differential transconductance stage 413. Also as in FIG. 3, current sources 103, 104, and 201 can comprise, as shown in FIG. 5, three substantially identical resistors 303, 305 and 307, and three substantially identical npn transistors 302, 304 and 306, with bases driven by a common bias voltage $V_{BIAS}$.

Because load resistor 108 conducts the combined collector currents of transistors 101 and 408, and load resistor 109 conducts the combined collector currents of transistors 102 and 409, the resistance values of load resistors 108 and 109 must be reduced from that of the respective load resistors 108 and 109 in the amplifier of FIG. 3 if it is desired that the same dc bias voltages be generated across the resistors in FIG. 5 as is generated in the circuit of FIG. 3. For example, if current sources 103, 104, 410 and 411 of FIG. 5 are designed to have nominal current values each approximately equal to that of current source 103 or 104 of FIG. 3, then the resistance values of load resistors 108 and 109 in FIG. 5 should be approximately one-half the values of the respective resistors in the circuit of FIG. 3 to get the same dc bias voltages across them. Further, if reference voltage generator circuit 500a were to include only the above-described first branch connected to load resistor 202—a simple and useful implementation of the present invention in an instrumentation amplifier—the resistance value of load resistor 202 would then be twice that of either resistor 108 or 109 to generate a reference voltage $V_{REF}$ that tracks the non-signal dc component of the voltage at the collectors of transistors 101 and 408.

Applicants have determined, however, that the common mode rejection ratio of an integrated circuit instrumentation amplifier of the type shown by the simplified schematic in FIG. 5 can be made more tolerant of non-ideal transistor characteristics by implementing reference voltage generator circuit 500a with an additional circuit branch connected to transconductance stage 414. The additional circuit branch, comprising npn transistor 502 and current source 504, duplicates transistor 408 and current source 410, and conducts current from load resistor 202. Again, current sources 504, 410, and 411 may comprise substantially identical circuits, each including a transistor (506, 508 and 510, respectively) and an emitter resistor (507, 509 and 511, respectively), and may be driven by a common bias voltage (which may, as shown in FIG. 5, but need not, be the same bias voltage $V_{BIAS}$ as applied to current sources 201, 103 and 104). The values of the emitter resistors of current sources 504, 410 and 411 may be varied equally from those of the emitter resistors of current sources 201, 103 and 104 if it is desired that the relative amounts of current available in the input transconductance stage 413 and the feedback transconductance stage be different.

In an embodiment of the present invention in which a circuit branch of the reference voltage generator circuit 500a is connected to each of transconductance stages 413 and 414, such as is shown in FIG. 5, the resistance value of load resistor 202 is made to be substantially equal to that of each of load resistors 108 and 109 because load resistor 202 now conducts a combined current of both stages like the combined current conducted by each of the load resistors 108 and 109. As with the amplifier of FIG. 3, known conventional integrated circuit device design and layout techniques can be used to match devices and temperature coefficients. An externally adjustable null network can be used for balancing the input transconductance stage 413, and resistor trim networks and bias current compensation also can be used to further reduce dc imbalances and bias errors in both the input and feedback transconductance stages.

Further, similar to the operational amplifier of FIG. 3, an instrumentation amplifier incorporating the present invention may use various conventional differential level shifting stages, or, preferably, may instead use, in a manner similar to that previously described in connection with the operational amplifier of FIG. 3, a non-differential level shifting stage such as is disclosed in applicants' aforementioned co-pending application to obtain greater bandwidth through that stage.

Applicants also have determined that the common-mode rejection ratio of instrumentation amplifier 500 is further improved at high frequencies by coupling a capacitor 512 of small capacitance (e.g., 0.75 pF) between the amplifier's non-inverting input terminal 106 and the emitter of transistor 304 in current source 103 of input transconductance stage 413, as shown in FIG. 5. This capacitor, which is preferably an integrated device, improves the common mode rejection by conducting current to charge and discharge the collector-base and collector-substrate capacitances inherent in transistor 304, such that the charging and discharging of these capacitances in response to high frequency common mode input changes does not result in significant variations in the current conducted by current source 103. A similar capacitor may also be coupled, if desired, between terminal 106 and the emitter of transistor 302 of reference generator circuit 500a.

Thus, differential amplifiers are described in which a reference voltage is generated. The reference voltage generator tracks precisely the non-signal dc conditions of a differential input stage, and is used in conjunction with output of the differential input stage to provide a single-ended input voltage to a level shifter so that feed-forward compensation can be utilized without the disadvantages of a shunt capacitor. Although preferred embodiments of the invention have been disclosed in simplified schematic circuits with various components shown connected to other components, persons of ordinary skill in the art will appreciate that it may not be necessary for such connections to be direct and additional components may be interconnected without departing from the spirit of the invention as shown. Persons skilled in the art will appreciate also that the present invention can be practiced by other than the described embodiments, which are presented for purposes of illustration and not of limitation, and the present invention is limited only by the claims which follow.

We claim:

1. In an amplifier circuit including a differential input stage having an output terminal, and a second stage having first and second input terminals and an output terminal, the output terminal of the input stage being coupled to the first input terminal of the second stage to supply an input voltage having a non-signal dc component to the second stage, a reference voltage circuit comprising:

first means, having an input terminal connected to an input terminal of the differential input stage and an output terminal, for generating at the first means output terminal a reference voltage substantially equal to the non-signal dc component of the input voltage supplied to the first input terminal of the second stage; and second means for supplying the reference voltage to the second input terminal of the second stage.

2. The amplifier circuit of claim 1, wherein the second stage comprises a level shifting stage of an operational amplifier circuit.

3. The amplifier circuit of claim 2, wherein the differential input stage comprises first and second circuits coupled respectively to first and second input terminals of the differential input stage, each of the first and second circuits comprising a transistor, a current source coupled to the emitter of the transistor, and a current to voltage converter coupled between the collector of the transistor and a first power supply voltage, the differential input stage further comprising an emitter resistor coupled between the emitter of the transistor of the first circuit and the emitter of the transistor of the second circuit.

4. The amplifier circuit of claim 3, wherein the reference voltage circuit comprises a transistor having a base coupled to the first input terminal of the differential input stage, a current source coupled to the emitter of the transistor, and a current to voltage converter coupled between the collector of the transistor and a power supply voltage, and wherein the collector of the transistor is coupled to the output terminal of the reference voltage circuit.

5. The amplifier circuit of claim 4, wherein the current to voltage converter of the reference voltage circuit comprises a resistor.

6. The amplifier circuit of claim 5, wherein the current to voltage converter of the first circuit of the differential input stage has a resistance value, and wherein the resistor comprising the current to voltage converter of the reference voltage circuit has a substantially equal resistance value.

7. The amplifier circuit of claim 4, wherein the first and second input terminals of the differential input stage respectively comprise non-inverting and inverting input terminals of the amplifier.

8. The amplifier circuit of claim 4, wherein the base of the transistor of the reference voltage circuit is coupled to the base of the transistor of the first circuit of the differential input stage, thereby causing the collector voltage of the transistor of the reference voltage circuit to track fluctuations in the non-signal dc component of the collector voltage of the transistor of the first circuit.

9. The amplifier circuit of claim 8, wherein the collector voltage of the transistor of the reference voltage circuit tracks fluctuations in the non-signal dc component of the collector voltage of the transistor in the first circuit that are responsive to common mode input voltage variations.

10. The amplifier circuit of claim 9, wherein the tracked fluctuations in the non-signal dc component of the collector voltage of the transistor in the first circuit include fluctuations resulting from finite output resistance in the current source of the first circuit.

11. The amplifier circuit of claim 10, wherein the current sources of the reference voltage and first circuits of the differential input stage each comprises a current source transistor and a resistor coupled between the emitter of the current source transistor and a second power supply voltage.

12. The amplifier circuit of claim 11, wherein the bases of the current source transistors of the reference voltage circuit and the first circuit of the differential input stage are biased by a common bias voltage.

13. In an instrumentation amplifier circuit including a differential transconductance input stage having an output terminal, a differential transconductance feedback stage having an output terminal, and a second stage having first and second input terminals and an output terminal, the output terminals of the differential transconductance input and feedback stages being coupled to current to voltage converter means and to the first input terminal of the second stage for supplying an input voltage having a non-signal dc component to the second stage, a reference voltage circuit comprising:

first means, having an input terminal connected to an input terminal of the differential transconductance input stage and an output terminal, for generating at the output terminal of the first means a reference voltage substantially equal to the non-signal dc component of the input voltage supplied to the first input terminal of the second stage; and second means for supplying the reference voltage to the second input terminal of the second stage.

14. The instrumentation amplifier circuit of claim 13, wherein the second stage comprises a level shifting stage.

15. The instrumentation amplifier of claim 14, wherein the first means of the reference voltage circuit has a second input terminal connected to an input terminal of the differential transconductance feedback stage.

16. The instrumentation amplifier circuit of claim 13, wherein the differential transconductance input stage comprises first and second circuits coupled respectively to first and second input terminals of the differential transconductance input stage, each of the first and second circuits comprising a transistor and a current source coupled to the emitter of the transistor, and wherein a current to voltage converter is coupled between the collector of the transistor and a first power supply voltage, the instrumentation amplifier circuit further comprising an emitter resistor coupled between the emitter of the transistor of the first circuit and the emitter of the transistor of the second circuit.

17. The instrumentation amplifier circuit of claim 16, wherein the reference voltage circuit comprises a first branch circuit including a transistor having a base coupled to the first input terminal of the differential transconductance input stage and a current source coupled to the emitter of the transistor, and a current to voltage converter coupled between the collector of the transistor and a power supply voltage, and wherein the collector of the transistor is coupled to the output terminal of the reference voltage circuit.

18. The instrumentation amplifier circuit of claim 17, wherein the differential transconductance feedback stage comprises third and fourth circuits coupled respectively to reference and feedback input terminals of the differential transconductance feedback stage, each of the third and fourth circuits comprising a transistor and a current source coupled too the emitter of the transistor, and wherein one of the current to voltage converters coupled to the differential transconductance input stage is coupled between the collector of the transistor and the first power supply voltage, the instrumentation amplifier circuit further comprising an emitter resistor coupled between the emitter of the transistor of the third circuit and the emitter of the transistor of the fourth circuit.

19. The instrumentation amplifier of claim 18, wherein the reference voltage circuit further comprises a second branch circuit including a transistor having a base coupled to the reference input terminal of the differential feedback transconductance stage and a current source coupled to the emitter of the transistor, and where the current to voltage converter coupled to the first branch circuit of the reference voltage circuit is coupled between the collector of the transistor and a power supply voltage, and wherein the collector of the transistor is coupled to the output terminal of the reference voltage circuit.

20. The instrumentation amplifier circuit of claim 19, wherein the current to voltage converters of the first and second branch circuits of the reference voltage circuit comprise a common resistor.

21. The instrumentation amplifier of claim 20, wherein the current voltage converters of the first circuit of the differential transconductance input stage and the third circuit of the differential transconductance feedback stage comprise a common resistor having a resistance value, and wherein the common resistor comprising the current to voltage converters of the first and second branch circuits of the reference voltage circuit has a substantially equal resistance value.

22. The instrumentation amplifier circuit of claim 19, wherein the base of the transistor of the first branch of the reference voltage circuit is coupled to the base of the transistor of the first circuit of the differential transconductance input stage.

23. The instrumentation amplifier circuit of claim 22, wherein the base of the transistor of the second branch of the reference voltage circuit is coupled to the base of the transistor of the third circuit of the differential feedback transconductance stage.

24. The instrumentation amplifier circuit of claim 23, wherein the current sources of the first and second branch circuits of the reference voltage circuit and the first, second, third, and fourth circuits of the differential transconductance input and feedback stages each comprises a current source transistor and a resistor coupled between the emitter of the current source transistor and a second power supply voltage.

25. The instrumentation amplifier circuit of claim 24, wherein the bases of the current source transistors of the reference voltage circuit and the first, second, third and fourth circuits of the differential transconductance input and feedback stages are biased by a common bias voltage.

26. The instrumentation amplifier circuit of claim 17, wherein the first input terminal of the differential transconductance input stage comprises a non-inverting input terminal of the instrumentation amplifier.

27. The instrumentation amplifier circuit of claim 13, wherein the differential transconductance input stage comprises first and second circuits coupled respectively to non-inverting and inverting input terminals of the instrumentation amplifier, each of the first and second circuits comprising a transistor and current source coupled to the emitter of the transistor, the current source of the first circuit comprising a current source transistor having a collector-base capacitance and a collector-substrate capacitance, and the instrumentation amplifier circuit further comprising a capacitor coupled between the non-inverting input terminal of the instrumentation amplifier and the emitter of the first circuit current source transistor for conducting current responsive to changes in voltage at the non-inverting input to charge and discharge the collector-base and collector-substrate capacitances of the first circuit current source transistor.

28. In an integrated circuit for use in a differential amplifier circuit, the integrated circuit including a differential input stage, a second stage having first and second differential inputs for receiving first and second voltage signals respectively to drive the second stage, and non-inverting and inverting input terminals coupled to the differential input stage for connection to external components to implement the amplifier circuit, a method for providing the first and second drive voltage signals to the first and second inputs of the second stage, comprising the steps of:

generating first and second differential collector currents in the differential input stage responsive to voltages applied to the non-inverting and inverting terminals of the integrated circuit;

supplying each differential collector current to a respective current to voltage converter to generate first and second differential voltages each having a non-signal dc component and one having a signal component;

providing the first differential voltage to the first input of the second stage as the first drive voltage signal;

generating a reference current responsive to the voltage applied to the non-inverting input terminal of the integrated circuit;

supplying the reference current to a current to voltage converter to generate a reference voltage having a magnitude substantially equal to the non-signal dc component of the second differential voltage; and providing the reference voltage to the second input of the second stage as the second drive voltage signal.

* * * * *

UNITED STATES PATENT AND TRADEMARK OFFICE
CERTIFICATE OF CORRECTION

PATENT NO. : 5,148,119
DATED : September 15, 1992
INVENTOR(S) : John W. Wright and Robert C. Dobkin It is certified that error appears in the above-indentified patent and that said Letters Patent is hereby corrected as shown below:

Title page, item [56],
Under References Cited

"LM101A/LM201A/LM301" should be -- LM101A/LM201A/LM301A --

"'LM118/LM218/LM318 Operational Amplifiers,' National Semiconductor Corporation 1986 Linear Databook" should be -- "LM118/LM218/LM318 Operational Amplifiers,' National Semiconductor Corporation 1982 Linear Databook" --

Column  Line 12    44   "too" should be -- to --.

13     2   After "current", insert -- to --.

Signed and Sealed this

Seventh Day of March, 1995

Attest:

BRUCE LEHMAN

*Attesting Officer*  *Commissioner of Patents and Trademarks*